United States Patent [19]

Terai et al.

[11] Patent Number: 4,924,962

[45] Date of Patent: May 15, 1990

[54] SOUND REPRODUCING APPARATUS FOR USE IN VEHICLE

[75] Inventors: Kenichi Terai, Osaka; Shuji Saiki, Hirakata; Kousaku Murata, Kobe; Katsuaki Satoh, Osaka; Yoichi Kumura, Ashiya; Yasutoshi Nakama, Ikoma; Michiko Ogawa, Osaka; Shuichi Obata, Kyoto, all of Japan

[73] Assignee: Matsushita Electric Industrial Co., Ltd., Osaka, Japan

[21] Appl. No.: 71,829

[22] Filed: Jul. 10, 1987

[30] Foreign Application Priority Data

| | | | |
|---|---|---|---|
| Jul. 11, 1986 | [JP] | Japan | 61-164108 |
| Nov. 7, 1986 | [JP] | Japan | 61-266031 |
| Nov. 7, 1986 | [JP] | Japan | 61-266032 |
| Nov. 14, 1986 | [JP] | Japan | 61-272520 |
| Dec. 4, 1986 | [JP] | Japan | 61-289265 |

[51] Int. Cl.[5] .......... H05K 5/00

[52] U.S. Cl. .......... 181/141; 181/144; 181/150; 181/153; 181/155; 181/156; 181/199; 181/296; 381/86; 381/90; 381/154

[58] Field of Search .......... 181/144, 141, 152, 153, 181/199, 156, 150, 155, 296; 381/86, 90, 154; 367/191

[56] References Cited

U.S. PATENT DOCUMENTS

| | | | |
|---|---|---|---|
| 2,224,919 | 12/1940 | Olson | 181/152 |
| 2,277,525 | 3/1942 | Mercurius | 181/156 |
| 2,646,852 | 7/1957 | Forrester | 181/156 |
| 3,276,538 | 10/1966 | Guyton et al. | 181/141 |
| 3,300,583 | 1/1967 | Mikelevicius | 381/86 X |
| 3,393,766 | 7/1968 | Mitchell | 181/153 X |
| 4,085,289 | 4/1978 | Schmidelen | 181/153 X |
| 4,346,914 | 8/1982 | Livers et al. | 367/191 X |
| 4,493,389 | 1/1985 | Del Rosario | 181/152 |
| 4,567,959 | 2/1986 | Prophit | 181/156 |
| 4,572,326 | 2/1986 | Hutchins | 181/150 |
| 4,628,528 | 12/1986 | Bose et al. | 181/145 X |

FOREIGN PATENT DOCUMENTS

| | | |
|---|---|---|
| 3404655 | 8/1985 | Fed. Rep. of Germany . |
| 8530740 | 4/1986 | Fed. Rep. of Germany . |
| 2102656 | 2/1983 | United Kingdom . |

*Primary Examiner*—Benjamin R. Fuller
*Attorney, Agent, or Firm*—Spencer & Frank

[57] ABSTRACT

A sound reproducing apparatus for use in a vehicle having a speaker system constituted by at least one acoustic duct and a speaker unit disposed at a throat of the acoustic duct, an opening formed at the other end of the acoustic duct facing the passenger compartment of a vehicle. The apparatus is arranged such that, F0 and Fs are substantially equal to each other. Where Fs is the lowest frequency in a frequency range within which the imaginary part of the acoustic impedance at the sound radiating surface of the speaker system in the direction of the space within the passsenger compartment is zero and F0 is the low-range resonance frequency of the speaker system itself in the free space.

23 Claims, 12 Drawing Sheets

SOUND REPRODUCING APPARATUS FOR USE IN VEHICLE

BACKGROUND OF THE INVENTION

1. Field of the Invention

This invention relates to a sound reproducing apparatus for use in a closed space, such as, for example, the passenger compartment of a vehicle.

2. Description of the Prior Art

Sound reproducing apparatuses such as compact disk players have been lately improved in performance, and there is an increasing demand for expansion of the sound range to reproduce super-bass sound with respect to low-range sound reproduction in the passenger compartment of a vehicle. With this background, a sound reproducing apparatus for use in the passenger compartment of a vehicle such as that shown in FIG. 14 has been known. In FIG. 14, reference numeral 16 denotes a speaker unit and reference numeral 17 denotes a rear trunk. In this example, the rear trunk 17 is used as an enclosed cavity on the rear side of the speaker unit 16 so as to expand the low frequency range of sound pressure frequency response in the passenger compartment of the vehicle.

FIG. 15 shows another example of a conventional apparatus which has a speaker system 18 of closed type having a small capacity or a system of bass-reflex type and an electric compensation means 19 such as a tone control or graphic equalizer.

In this example, the falling characteristic of the speaker system 18 in the low range is adjusted or improved by the electric compensation means 19 so as to expand the low frequency range of sound pressure frequency response in the passenger compartment. FIG. 16 shows an example of the frequency characteristic (a) of the speaker system and an example (b) of the electric compensation means.

However, the conventional arrangement shown in FIG. 14 cannot be applied to a type of vehicle such as a so-called hatch-back car or station wagon which is constructed without any closed rear trunk. Even when it is applied to the type of vehicle that has a rear trunk, the only feasible method of designing the interior sound pressure frequency characteristics is one wherein the constants of the speaker unit itself are changed. The degree of design freedom for this arrangement is thus very restricted.

The conventional arrangement shown in FIG. 15 is free from this problem, but it requires large input power for the speaker unit in the low frequency range because of the use of electric compensation means 19, thereby necessitating the provision of a relatively high power amplifier of. There is also a problem of distortion due to increased signal amplitude affecting the tone quality.

SUMMARY OF THE INVENTION

In consideration of the above-described problems, the present invention provides a sound reproducing apparatus for use in a vehicle which is capable of making the sound pressure frequency response curve relatively flat without increasing the level of distortion in the low-frequency range even when applied to a type of vehicle having no closed space and which can be designed most suitably in accordance with the type of vehicle and its mounted position.

To this end, the present invention provides a sound reproducing apparatus for use in a vehicle which is arranged such that there is a lowest frequency Fs in a frequency range within which the imaginary part of the acoustic impedance at the sound radiating surface of a speaker system in the direction of the space within the passenger compartment is zero, and the first low-range resonance frequency of the speaker system itself in the free space is F0, where F0 and Fs are substantially equal to each other.

The frequency Fs is obtained by simultation or observation effected at the position at which the speaker system is mounted in the closed space or the passenger compartment. It has been found that when a speaker unit operates in a stiffness-control region at frequencies lower than Fs, as in the case of a so-called headphone, the sound pressure will increase under the driving condition of a constant acceleration. It is possible to design the speaker system by estimating a sound pressure frequency characteristic in the low-frequency range in the passenger compartment as mentioned above. If the speaker system is constructed so as to have an acoustic duct, the level of vibration of the speaker unit and, hence, distortion caused by the vibration are greatly reduced in a low frequency range in the vicinity of Fs because of the phenomenon of resonance of the acoustic duct.

DESCRIPTION OF THE PREFERRED EMBODIMENTS

The present invention will be described below with respect to preferred embodiments thereof with reference to the accompanying drawings.

Figure 1:
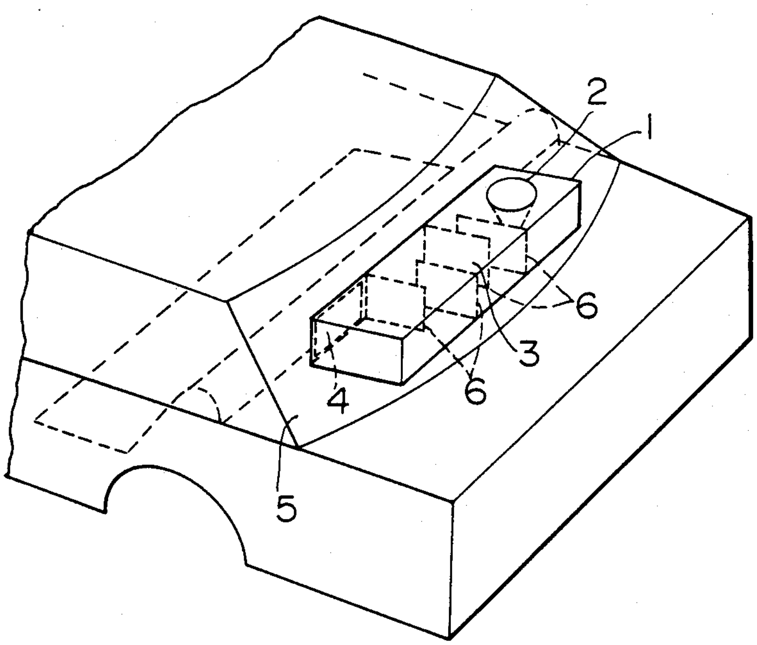
FIG. 1 is a perspective view of a sound reproducing apparatus for use in a vehicle which represents a first embodiment of the present invention and of the position at which the apparatus is mounted in the passenger compartment.
Figure 2:
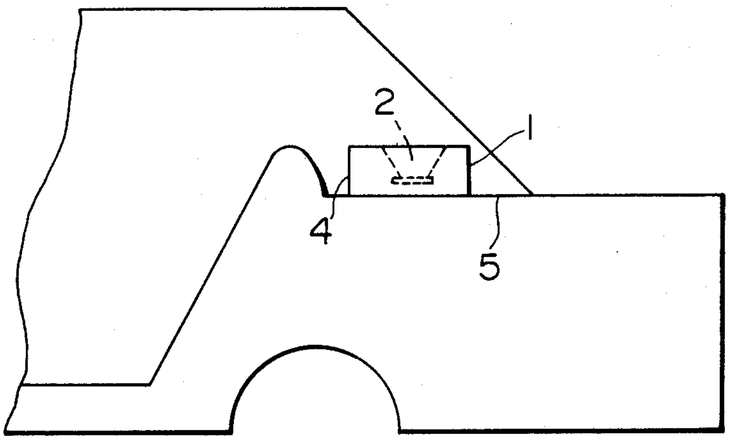
FIG. 2 is a schematic side view of the apparatus shown in FIG. 1.
Figure 3:
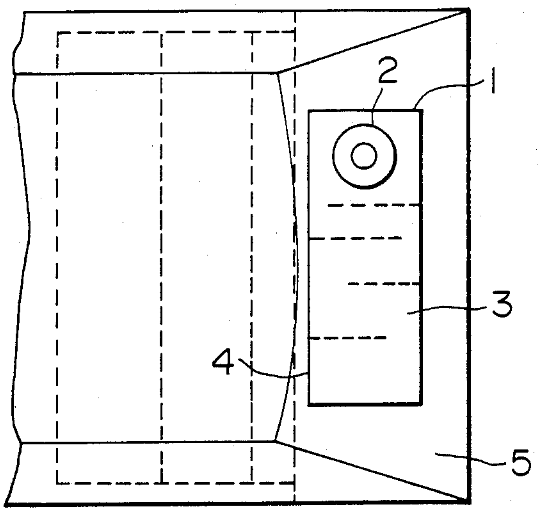
FIG. 3 is a top view of the apparatus shown in FIG. 1.

FIG. 1 is a perspective view illustrating a sound reproducing apparatus for use in a vehicle which represents a first embodiment of the present invention as well as the mounting position of this apparatus. FIG. 2 is a schematic side view and FIG. 3 is a top view of this apparatus. As shown in FIG. 3, a speaker system 1 is provided with a speaker unit 2 and an acoustic duct 3 which is subdivided by a plurality of partition plates 6 and which has an opening 4. A rear tray 5 is formed in the passenger compartment.

The operation of the thus constituted sound reproducing apparatus for use in a vehicle will be described below.

The difference between the acoustic characteristics displayed when the speaker system is mounted in a closed space such as the passenger compartment of a vehicle and the acoustic characteristics in a free space represented by an anechoic room is first explained before the description of this embodiment.

For the explanation, the influence on the speaker system when the speaker system is brought into the closed space in the passenger compartment is examined by obtaining the acoustic impedance at the sound radiating surface of the speaker system in when facing the direction of the internal space of the passenger compartment.

Figure 5:
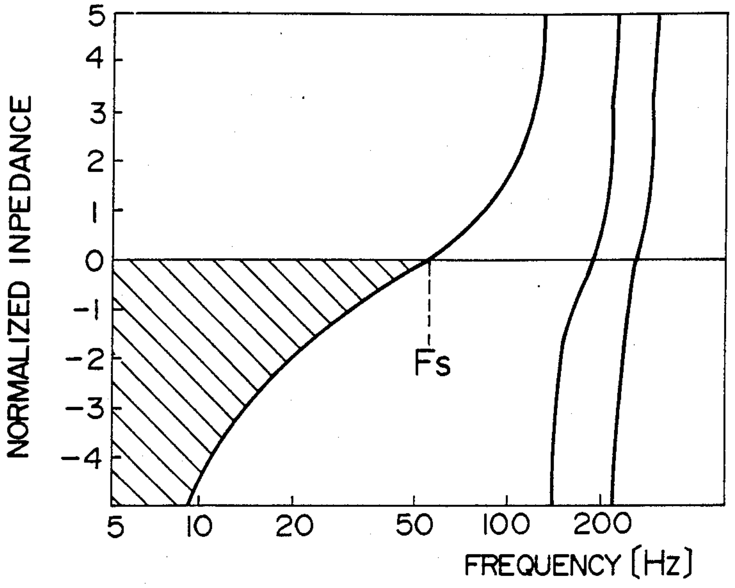
FIG. 5 is a characteristic diagram in which the imaginary part of the interior acoustic impedance varies with frequency, for the speaker system shown in FIG. 4.

FIG. 5 shows the imaginary part of the acoustic impedance in the passenger compartment when the sound radiating surface of the speaker system 1 shown in FIG. 1 is driven. The sound radiating surface includes the front surface of the speaker unit 2 and the radiating surface of the opening 4 of the acoustic duct, which are driven at the same time. The ordinate in FIG. 5 has been normalized by the impedance of a plane wave in the air.

As shown in FIG. 5, the value of the impedance is negative in a hatched region below about 60 Hz. From the acoustic equation $1/j\omega C = j(-1/\omega C)$, where C is the acoustic compliance of the compartment, this is considered to be an indication of a capacitive acoustic state. If the transition frequency is Fs, the sound pressure increases as the frequency is reduced in the region below Fs, as shown in FIG. 6, when the sound radiating surface is driven at a constant acceleration relative to frequency.

Therefore, it is possible to flatten the characteristic curve of a frequency range below Fs by setting the sound pressure frequency characteristic of the speaker system in the free space to correspond to the characteristic reverse of that shown in FIG. 6. Ordinarily, this can be readily effected by designing the speaker system so that its low-range resonance frequency in the free space, which is referred to as FO, is equal to Fs.

Figure 4:
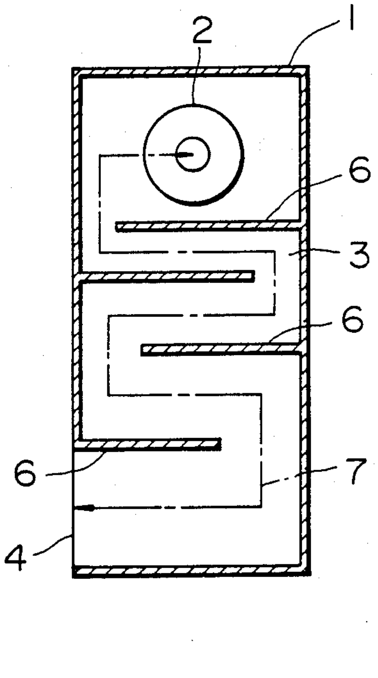
FIG. 4 is a schematic cross-sectional view of the structure of a speaker system in the first embodiment of the present invention.

The operation of the speaker system 1 in accordance with the first embodiment will be described below with reference to FIG. 4. As shown in FIG. 4, the partition plates 6 constitute the acoustic duct 3, as shown in FIG. 3. A reference numeral 7 denotes the center line of the acoustic duct 3 which connects the center of the speaker unit 2 and the center of the opening 4 to each other. The sound output which is supplied from the reverse side of the speaker unit 2 passes through the acoustic duct 3 and is thereafter output from the opening face of the opening 4 of the acoustic duct. If the length of the center line is L1 and if L1 is set to be a half of the wave length corresponding to Fs, that is, $C/(2 \cdot Fs)$, the sound pressure frequency characteristic of the output power of sound radiated from the front surface of the speaker unit 2 is observed as indicated by the broken line 8 in FIG. 7. The sound pressure frequency characteristic of the output power of sound radiated from the opening face of the opening 4 of the acoustic duct is as indicated by the dashed line 9, and the combined sound pressure frequency characteristic of these characteristics is indicated by the solid line 10.

Figure 6:
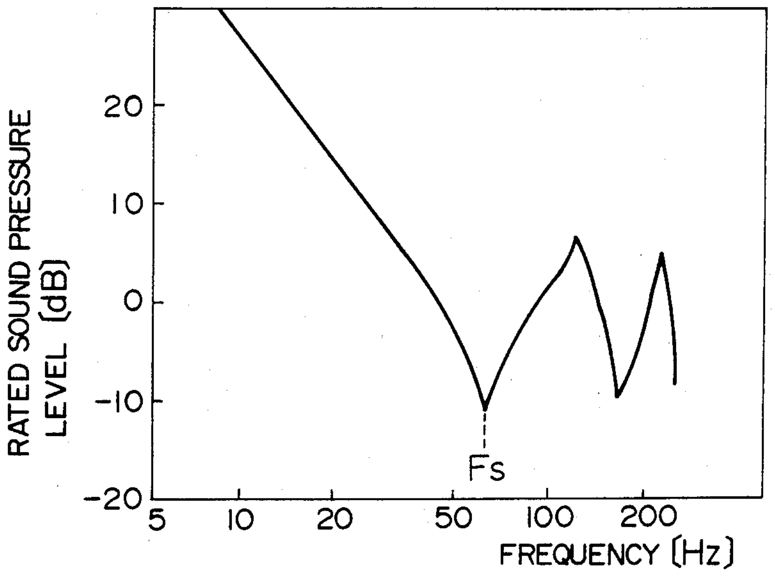
FIG. 6 is a graph of a sound pressure frequency characteristic displayed when a sound radiating surface or a diaphragm of the same speaker system is driven at a constant acceleration relative to frequency.
Figure 7:
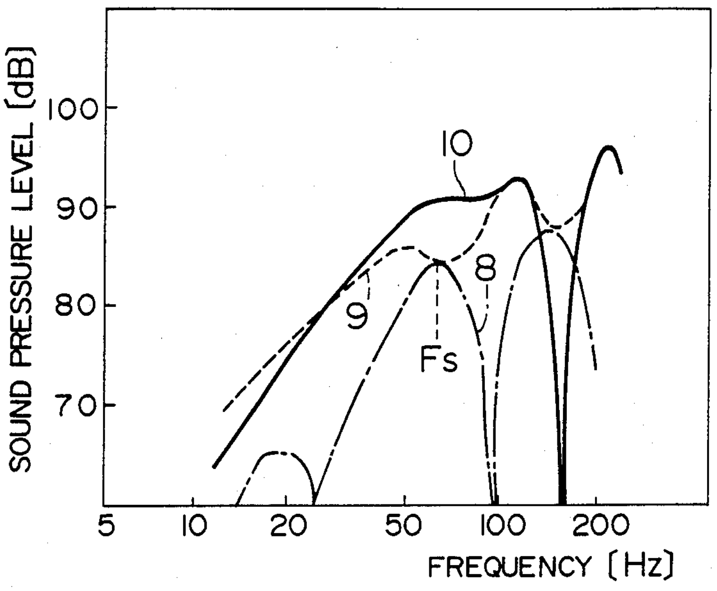
FIG. 7 is a graph of sound pressure frequency characteristics of the speaker system of FIG. 4 in an automobile free space.
Figure 8:
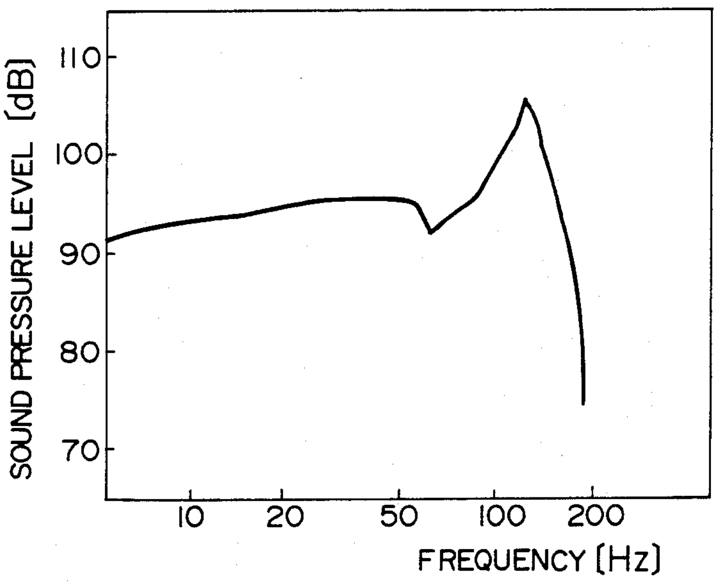
FIG. 8 is a graph of sound pressure frequency characteristics of the same speaker system in the passenger compartment.

If the above-described speaker system is placed on the rear tray provided in the passenger compartment, the sound pressure rises as the frequency is reduced below Fs, as shown in FIG. 6, resulting in the characteristic shown in FIG. 7. In this state, the radiated sound output of the speaker unit 2 itself is small as represented by the characteristic curve indicated by the chain line 8 in FIG. 7 and, therefore, the distortion caused in the speaker unit 2 can be limited to a low level, so that there is relatively little deterioration in the sound quality due to distortion even when the sound pressure increases at frequencies below Fs. Thus, it is possible to form a generally flat curve of the sound pressure frequency characteristic below Fs in the passenger compartment as seen in FIG. 8 by designing the speaker system shown in FIG. 4 so as to set the length of the acoustic duct 3 to $L1 = C/(2 \cdot Fs)$. The apparatus can be used as, for example, a super woofer in a multichannel range-dividing system.

Figure 9:
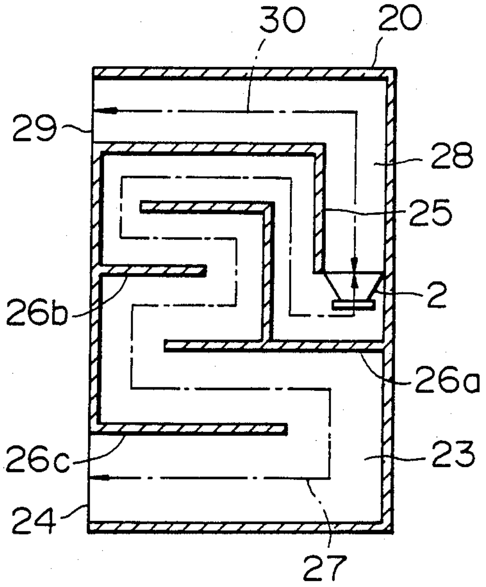
FIG. 9 is a schematic cross-sectional view of the structure of a speaker system in a second embodiment of the present invention.

Next, a second embodiment of the present invention will be described with reference to FIG. 9. As shown in FIG. 9, the reproducing apparatus is provided with a speaker system 20 having two openings 24 and 29, and partition plates 25, 26*a*, 26*b*, 26*c* which constitute two acoustic ducts 28 and 23. The acoustic duct 28 provides communication between the front side of the speaker unit 2 and the opening 29, and the acoustic duct 23 provides communication between the rear side of the speaker unit 2 and the opening 24. In FIG. 9, a reference numeral 30 denotes the center line of the acoustic duct 28, a reference numeral 27 denotes the center line of the acoustic duct 23. In this embodiment, it is possible to effect the same operation as that of the first embodiment by setting a difference L2 between the center lines 30 and 27 to $L2 = C/(2 \cdot Fs)$.

Figure 10:
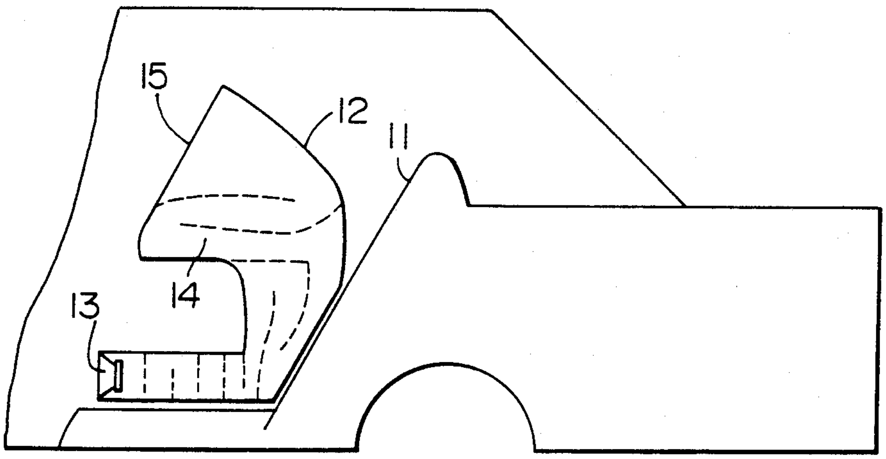
FIG. 10 is a schematic side view of the structure of a speaker system in a third embodiment of the present invention and the position at which the speaker system is mounted in the passenger compartment.

A third embodiment of the present invention will be described with reference to FIG. 10. FIG. 10 shows a speaker system 12 which is placed on a rear seat 11 disposed in the passenger compartment, a speaker unit 13, an acoustic duct 14 and an opening 15 of the acoustic duct. In this embodiment also, Fs is obtained from the change in the acoustic impedance in the passenger compartment observed over the rear seat 11, thereby calculating the length of the acoustic duct 14.

Figure 11A:
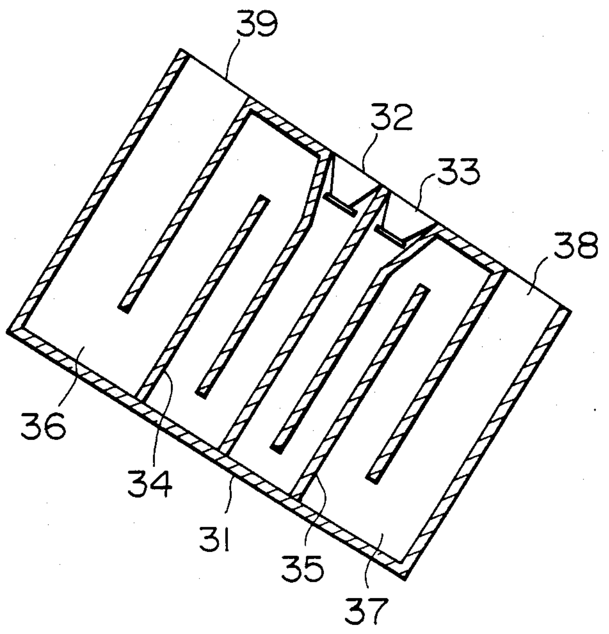
FIG. 11*a* is a cross-sectional view of the structure of a speaker system in a fourth embodiment of the present invention.
Figure 11B:
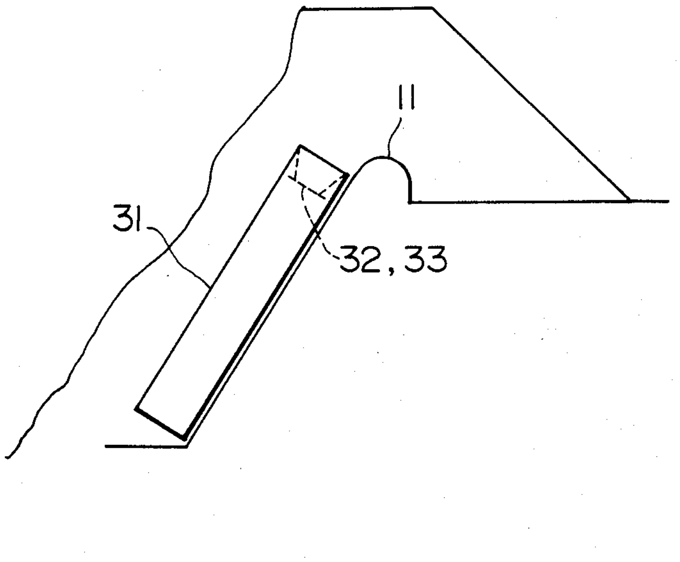
FIG. 11*b* is a schematic side view showing the position at which the speaker system shown in FIG. 11*a* is mounted in the passenger compartment.
Figure 12A:
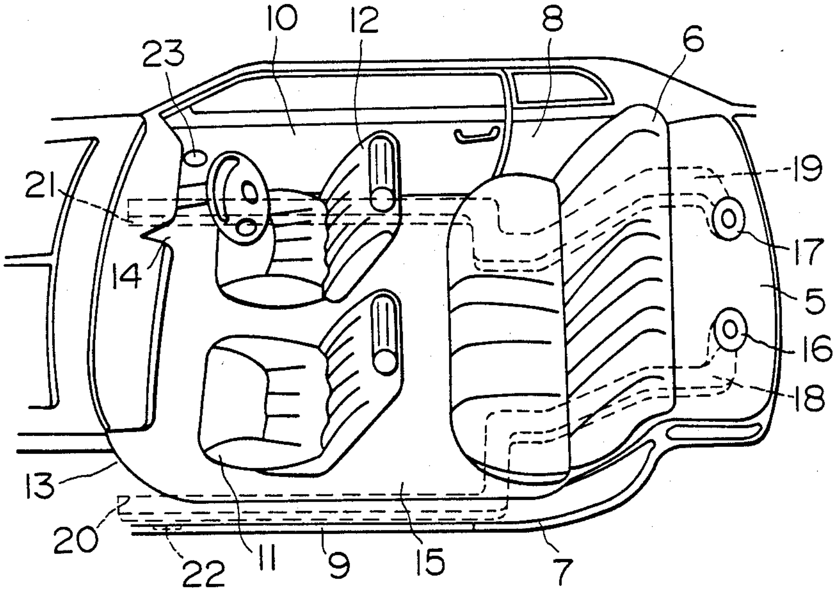
FIGS. 12*a* to 12*c* and FIGS. 13*a* to 13*d* are perspective views of sound reproducing apparatuses for use in a vehicle each having acoustic ducts formed by a part of the structure of the vehicle.
Figure 12B:
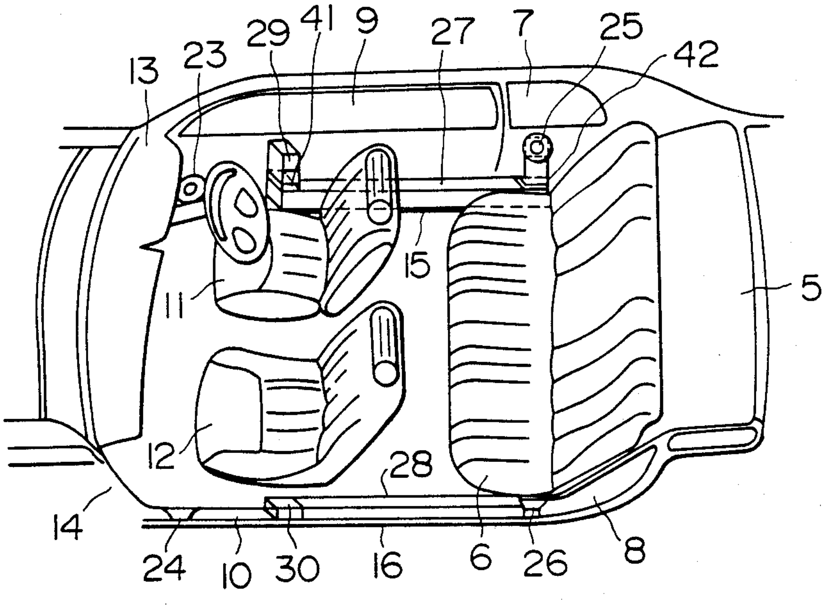
Figure 12C:
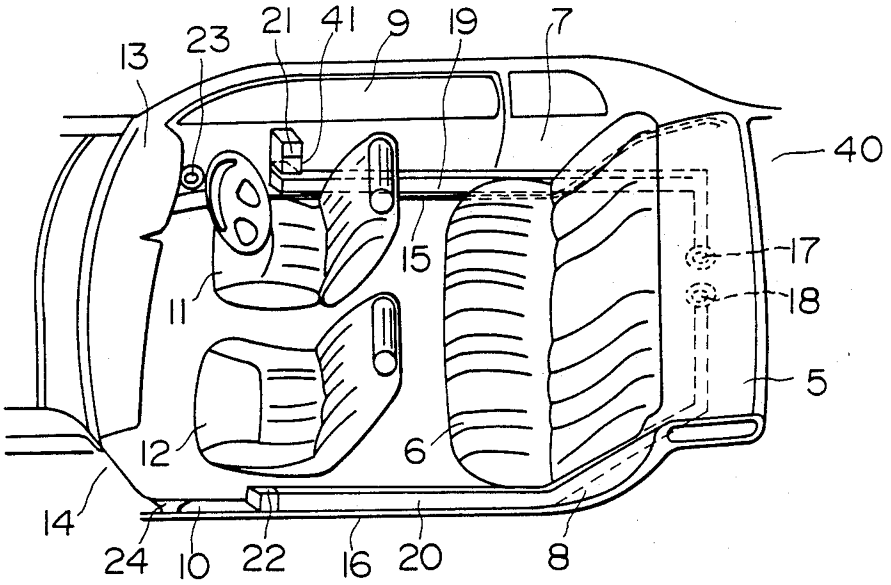
Figure 13A:
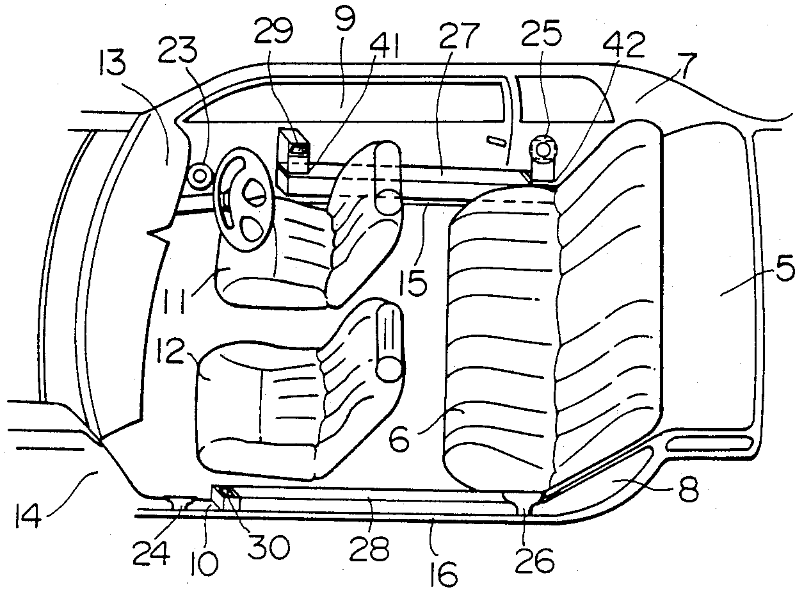
Figure 13B:
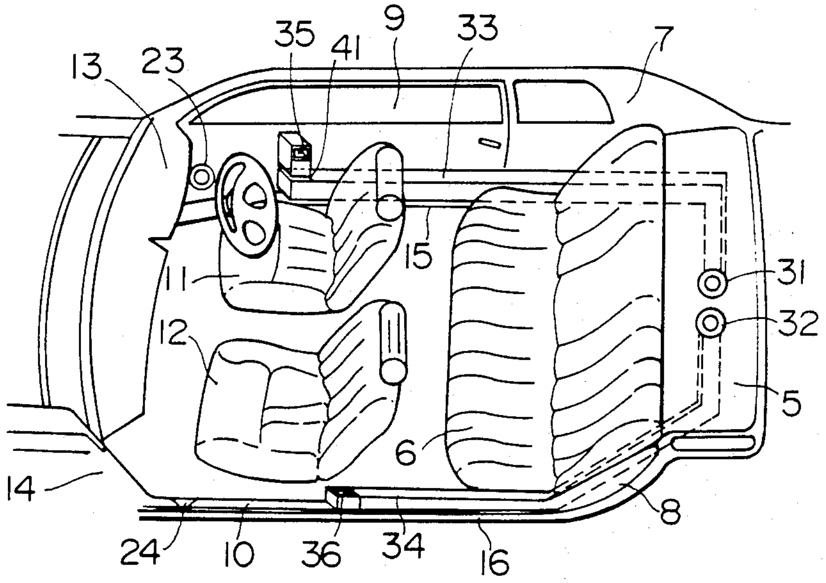
Figure 13C:
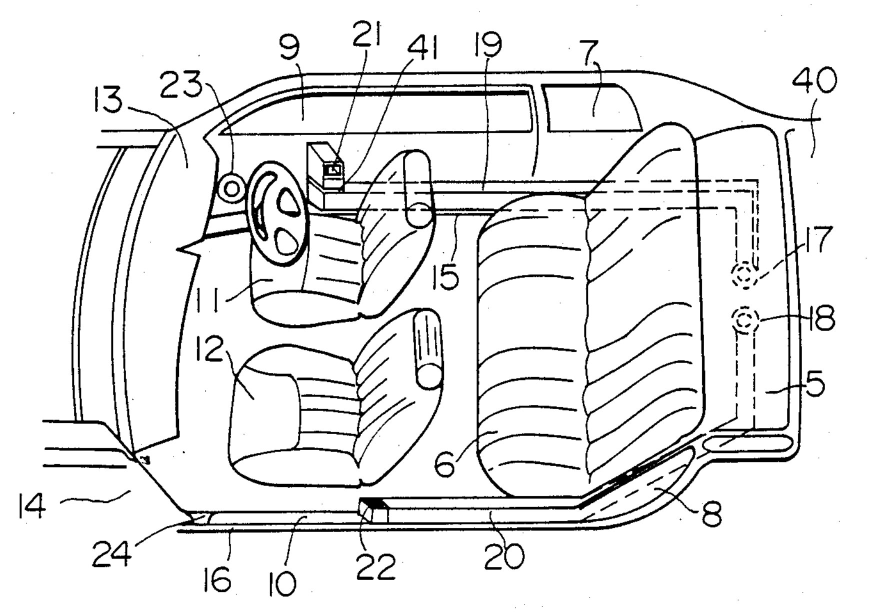
Figure 13D:
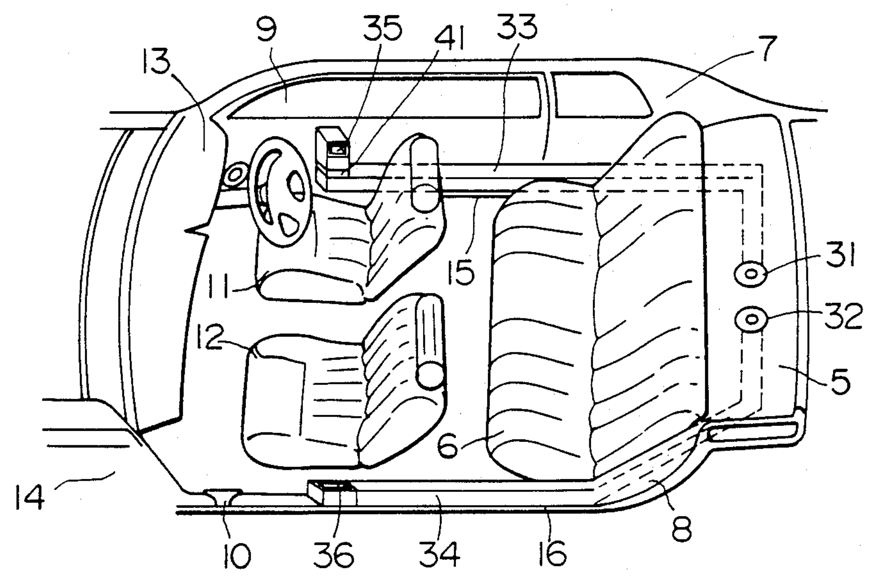
Figure 14:
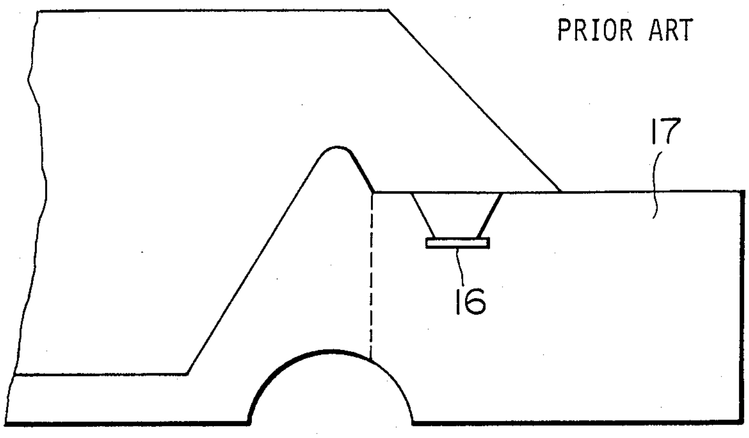
FIG. 14 is a schematic side view of a conventional interior sound reproducing apparatus utilizing a rear trunk.
Figure 15:
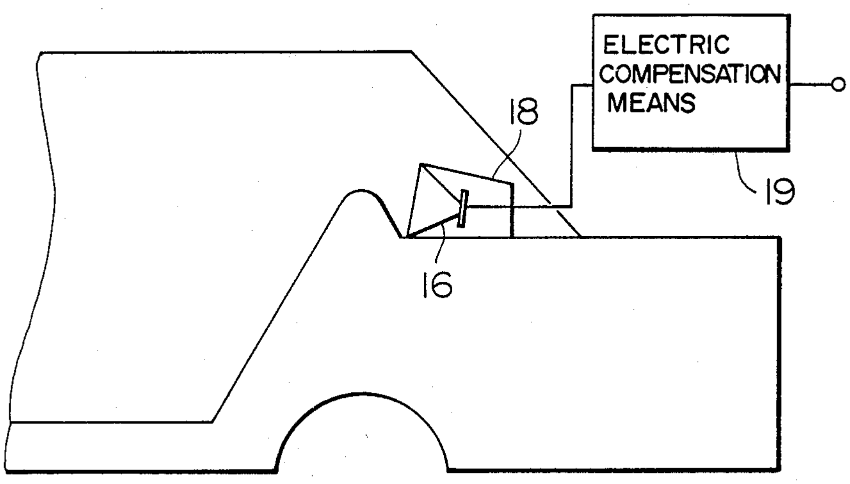
FIG. 15 is a schematic side view of a conventional interior sound reproducing apparatus using an electric compensation means.
Figure 16:
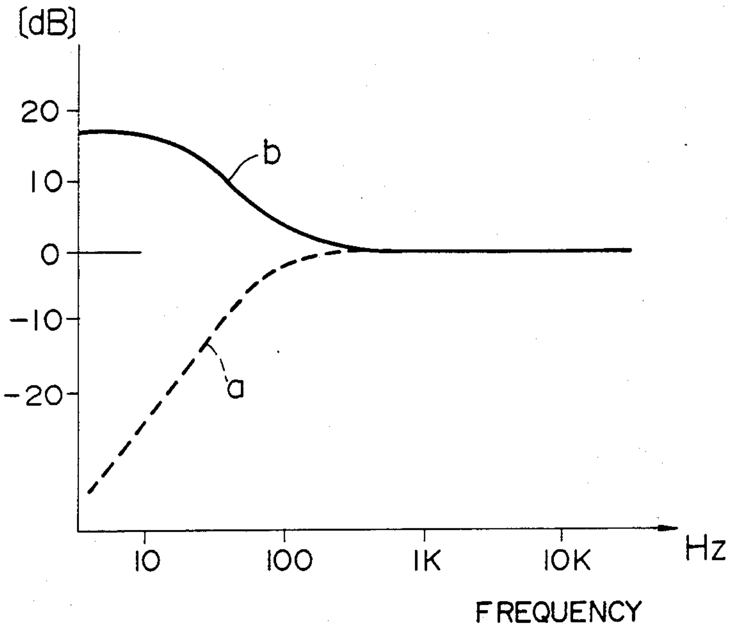
FIG. 16 is a characteristic diagram of sound level versus the frequency characteristic of the sound reproducing apparatus of FIG. 15 having an electric compensation means and of sound level versus frequency characteristic in the passenger compartment in the case of the conventional apparatus of FIG. 14.

Further, a fourth embodiment of the present invention will be described with reference to FIG. 11. FIG. 11 (*a*) is a cross-sectional view of a speaker system 31, and FIG. 11(*b*) is a side view of the speaker system 31 placed on the backrest of the rear seat 11. FIG. 11(*a*) shows speaker units 32 and 33, acoustic ducts 36 and 37, partition plates 34 and 35 and an opening 38, 39 of the acoustic duct. This embodiment is arranged by using pairs of assemblies each of which are provided in accordance with the first embodiment so as to be adapted for two-channel stereo reproduction and so as to be capable of being integrated with or incorporated in the rear seat. The same design as in the case of the first embodiment is performed with respect to the length of the acoustic ducts 36 and 37.

In the above-described three embodiments, some part of the above-described effect is also realized under the following conditions of L1 and L2 because of phase margin:

$$C/(4 \cdot Fs) < L1 < C/(2 \cdot Fs)$$

or $$C/(4 \cdot Fs) < L2 < C/(2 \cdot Fs)$$

As described above, the present invention realizes a superior sound reproducing apparatus for use in a vehicle in which a speaker system disposed in a passenger compartment is designed such that the frequency Fs at which the imaginary part of the acoustic impedance from the speaker system in the mounted position toward the interior space of the passenger compartment becomes zero and the low-range resonance frequency F0 of the speaker system itself in the free space are set to be substantially equal to each other, thereby enabling the sound pressure frequency characteristic below these frequencies to be substantially flattened in accordance with the position at which the speaker system is mounted in the passenger compartment while limiting the distortion thereof to a low level. Moreover, these effects can be realized independently of the type of vehicle since the present invention does not utilize a specific type of vehicle structure such as a rear trunk.

In the above described embodiments, the acoustic ducts are constructed by using partition plates, but they may be formed by a part of the structure of the vehicle, as shown in FIGS. 12*a* to 12*c* and FIGS. 13*a* to 13*d*. In this case, the acoustic ducts may include a pair of parallel acoustic ducts equal or not equal to each other in length, or a system using only one acoustic duct may be applicable.

The sectional area of each acoustic duct may be increased in the direction approaching the opening so as to form a horn and enable an increased sound output by the horn effect.

In the case where the acoustic ducts are formed by the structure of the vehicle, the speaker units may be disposed in the trunk room, the rear doors or rear parcels. It will be understood by one skilled in the art that various types of duct arrangements are possible by the configuration of each duct, the combination of the number of acoustic ducts and whether an acoustic duct is formed on the front side, the rear side, or both the front and the rear sides of each speaker unit.

What is claimed is:

1. A speaker system for use in a closed space, comprising:

at least one speaker unit having sidewalls, sound producing means, and a sound radiation surface; said sound radiation surface being disposed at a predetermined location in said closed space, said predetermined location having an acoustic impedance within said closed space which has an imaginary component equal to zero at a frequency Fs, said frequency Fs being a lowest frequency at which said acoustic impedance has an imaginary component which is zero, said speaker unit operating in said closed space with a relatively flat sound pressure frequency response in a low-frequency range below said frequency Fs, whereby said speaker unit has a first, low-range resonance frequency FO when in a free-field space, said first, low-range resonance frequency FO of said speaker unit being substantially equal to said frequency Fs, wherein sound distortion caused by vibration of said speaker unit is reduced in a low frequency range in a vicinity of said frequency Fs.

2. A speaker system as set forth in claim 1, wherein said speaker unit includes duct means, wherein said speaker means are disposed at one end of said duct means, another end of said duct means being open to said closed space.

3. A speaker system as set forth in claim 1, wherein said closed space is a passenger compartment of a vehicle.

4. A speaker system as set forth in claim 2, wherein said acoustic duct has a plurality of partitions disposed therein.

5. A speaker system as set forth in claim 2, wherein said acoustic duct is a portion of a body structure of said vehicle.

6. A speaker system as set forth in claim 2, wherein one end of said acoustic duct is opened to a door portion of said vehicle.

7. A speaker system as set forth in claim 3, wherein said speaker unit is disposed in one of (a) a trunk portion and (b) a rear parcel compartment portion of said vehicle.

8. A speaker system for use in a closed space, comprising:

at least one speaker unit having sidewalls, sound producing means, and a sound radiation surface; said sound radiation surface being disposed at a predetermined location in said closed space, said predetermined location having an acoustic impedance within said closed space which has an imaginary component equal to zero at a frequency Fs, said frequency Fs being a lowest frequency at which said acoustic impedance has an imaginary component which is zero, said speaker unit operating in said closed space with a relatively flat sound pressure frequency response in a low-frequency range below said frequency Fs, and a duct, said duct having a length L1 along a centerline thereof, whereby L1 satisfies a condition $C/(4Fs) \leqq L1 \leqq C/(2Fs)$ where C is an acoustic compliance of said closed space, wherein sound distortion caused by vibration of said speaker unit is reduced in a low frequency range in a vicinity of said frequency Fs.

9. A speaker system as set forth in claim 8, wherein said duct means has a plurality of partitions disposed therein.

10. A speaker system as set forth in claim 8, wherein said closed space is a passenger compartment of a vehicle.

11. A speaker system as set forth in claim 10, wherein said duct means is a portion of a body structure of said vehicle.

12. A speaker system as set forth in claim 10, wherein one end of said duct means is open to a door portion of said vehicle.

13. A speaker system as set forth in claim 10, wherein said speaker unit is disposed in one of (a) a trunk portion and (b) a rear parcel compartment portion of said vehicle.

14. A speaker system for use in a closed space, comprising at least one speaker unit having sidewalls, sound producing means, and a sound radiation surface; said sound radiation surface being disposed in said closed space at a predetermined location, said predetermined location having an acoustic impedance within said closed space which has an imaginary component equal to zero at a frequency Fs, said frequency Fs being a lowest frequency at which said acoustic impedance has an imaginary component which is zero, said speaker unit operating in said closed space with a relatively flat sound pressure frequency response in a low-frequency range below said frequency Fs, a first duct disposed in front of said sound producing means, and a second duct means disposed at a rear of said sound producing means, whereby said first and second ducts have respective lengths along respective centerlines thereof which differ by a length L2 which satisfies a condition $C/(4Fs) \leqq L2 \leqq C/(2Fs)$ where C is an acoustic compliance of said closed space, wherein sound distortion caused by vibration of said speaker unit is reduced in a low frequency range in a vicinity of said frequency Fs.

15. A speaker system as set forth in claim 14, wherein each of said first and second duct means has a plurality of partitions disposed therein.

16. A speaker system as set forth in claim 15, wherein said closed space is a passenger compartment of a vehicle.

17. A speaker system as set forth in claim 15, wherein said first and second duct means are each formed by a portion of a body structure of a vehicle.

18. A speaker system as set forth in claim 16, wherein one end of each of said first and second acoustic ducts is open to a door portion of said vehicle.

19. A speaker system as set forth in claim 16, wherein said speaker unit is disposed in one of (a) a trunk portion and (b) a rear parcel compartment portion of said vehicle.

20. A method of reducing sound distortion of a speaker system for use in a closed space, comprising the steps of:

selecting a location within the closed space for mounting a speaker unit;

determining an acoustical impedance at said location within said closed space at a low-range frequency Fs having an imaginary component equal to zero, said frequency Fs being a lowest frequency at which the imaginary component of said acoustic impedance is zero, selecting the speaker unit that has sidewalls, sound producing means, and a sound radiation surface such that, when disposed in said closed space at said location said speaker unit would be characterized by having a first, low-range resonant frequency FO when in a free-field room, wherein said first, low-range resonant frequency FO is equal to frequency Fs, and sound distortion caused by vibration of said speaker unit is reduced in a low frequency range in a vicinity of said frequency Fs.

21. A method as set forth in claim 20, further comprising the following steps:

providing at least one acoustic duct, and disposing said speaker unit at one end of said duct, another end of said acoustic duct being in communication with said closed space.

22. A method as set forth in claim 20, wherein said closed space is a passenger compartment of a vehicle.

23. A method as set forth in claim 21, further comprising the step of disposing a plurality of partitions in said acoustic duct.

* * * * *